US010727891B2

(12) United States Patent
Ota

(10) Patent No.: US 10,727,891 B2
(45) Date of Patent: Jul. 28, 2020

(54) COMMUNICATION DEVICE

(71) Applicant: NIPPON SEIKI CO., LTD., Niigata (JP)

(72) Inventor: Satoshi Ota, Niigata (JP)

(73) Assignee: NIPPON SEIKI CO., LTD., Niigata (JP)

( * ) Notice: Subject to any disclaimer, the term of this patent is extended or adjusted under 35 U.S.C. 154(b) by 60 days.

(21) Appl. No.: 16/315,955

(22) PCT Filed: Jul. 11, 2017

(86) PCT No.: PCT/JP2017/025193
§ 371 (c)(1),
(2) Date: Jan. 7, 2019

(87) PCT Pub. No.: WO2018/021005
PCT Pub. Date: Feb. 1, 2018

(65) Prior Publication Data
US 2020/0186182 A1    Jun. 11, 2020

(30) Foreign Application Priority Data
Jul. 27, 2016  (JP) .................... 2016-147488

(51) Int. Cl.
*H04M 1/00* (2006.01)
*H04B 1/3888* (2015.01)
(Continued)

(52) U.S. Cl.
CPC .......... *H04B 1/3888* (2013.01); *G08C 17/02* (2013.01); *H04B 1/3883* (2013.01)

(58) Field of Classification Search
CPC .......... G05B 19/41855; G05B 19/0425; G05B 19/41845; G05B 2219/23406;
(Continued)

(56) References Cited

U.S. PATENT DOCUMENTS

2010/0290351 A1* 11/2010 Toepke ................. H04W 16/18
370/250
2012/0235479 A1* 9/2012 Seiler ................. H02J 7/00036
307/11
(Continued)

FOREIGN PATENT DOCUMENTS

CN    105488988 A    4/2016
JP    06-100097 A    4/1994
(Continued)

OTHER PUBLICATIONS

International Search Report issued in corresponding International Patent Application No. PCT/JP2017/025193, dated Sep. 19, 2017, with English Translation.

*Primary Examiner* — Kathy W Wang-Hurst
*Assistant Examiner* — Max Mathew
(74) *Attorney, Agent, or Firm* — McDermott Will & Emery LLP

(57) ABSTRACT

A control substrate is provided with a first electric current limiting resistor and a first voltage limiting Zener diode which are connected to a power supply line, and second electric current limiting resistors and second voltage limiting Zener diodes which are connected to communication lines. Of an electronic circuit configured from the control substrate and a sub-substrate, a first area connected to one side of the power supply line and the communication lines and a second area connected to the other side thereof with reference to the first and second electric current limiting resistors and the first and second voltage limiting Zener diodes are arranged spaced apart from each other by a predetermined interval so that the areas are considered separate areas in terms of intrinsically safe explosion-proof requirements.

4 Claims, 3 Drawing Sheets

(51) Int. Cl.
  *G08C 17/02* (2006.01)
  *H04B 1/3883* (2015.01)
(58) Field of Classification Search
  CPC .......... G05B 2219/31197; G05B 2219/31151;
         G05B 2219/25428; G06Q 50/04; Y02P
                    90/185; Y02P 90/10
  USPC .......................................... 455/575.1, 575.8
  See application file for complete search history.

(56) References Cited

U.S. PATENT DOCUMENTS

| | | | |
|---|---|---|---|
| 2014/0129036 A1* | 5/2014 | Durbhaka | G05B 15/02 |
| | | | 700/282 |
| 2016/0119356 A1* | 4/2016 | Ootaki | H04L 67/125 |
| | | | 726/4 |
| 2016/0165812 A1* | 6/2016 | Lee | A01G 9/24 |
| | | | 700/276 |
| 2017/0269580 A1* | 9/2017 | Hirahatake | G05B 23/0229 |
| 2017/0322027 A1* | 11/2017 | Delker | G01C 19/02 |
| 2017/0367277 A1* | 12/2017 | Mohindra | A01G 25/162 |
| 2018/0007699 A1* | 1/2018 | Ishii | H04W 16/12 |
| 2018/0024029 A1* | 1/2018 | Ota | G05B 23/0221 |
| | | | 702/182 |
| 2018/0066804 A1* | 3/2018 | Grumstrup | F17D 5/005 |
| 2018/0246499 A1* | 8/2018 | Ota | G05B 19/41845 |

FOREIGN PATENT DOCUMENTS

| | | |
|---|---|---|
| JP | 07-95221 A | 4/1995 |
| JP | 2006-079134 A | 3/2006 |
| JP | 2009-054940 A | 3/2009 |

* cited by examiner

COMMUNICATION DEVICE

CROSS REFERENCE

This application is the U S. National Phase under 35 U.S.C. § 371 of International Application No. PCT/JP2017/025193, filed on Jul. 11, 2017, which claims the benefit of Japanese Application No. 2016-147488, filed on Jul. 27, 2016, the entire contents of each are hereby incorporated by reference.

TECHNICAL FIELD

The present invention relates to an improved communication device.

BACKGROUND ART

A communication device capable of performing radio communication between a control substrate housed in a case and a device disposed outside the case is known As a conventional technique relating to such a communication device, there is a technique disclosed in Patent Literature 1.

The communication device such as that shown in Patent Literature 1 is assumed to be used in a dangerous area The dangerous area is a place in a general factory, where that is a risk that explosive gas could mix with air and generate a dangerous atmosphere having a lower explosion limit or more A communication device assumed to be used in the dangerous area is required to comply with intrinsically safe explosion-proof requirements (JIS C60079).

The communication device is configured to be such that a control substrate and a sub-substrate connected to the control substrate via a connector are housed in a metal case This is because, in order to suppress an increase in size of the communication device, a configuration which is provided with a sub-substrate for performing communication in addition to a control substrate and which connects both substrates by a connector is desirable An opening is formed in the case for performing communication, and a window member faces this opening.

Meanwhile, the communication device used in a dangerous area is restricted in electric power and capacity (inductance and capacitance) so as to comply with intrinsically safe explosion-proof requirements, and it is necessary to further limit the capacity when the electric power increases with an increase in a size of an electronic circuit Therefore, in order to alleviate the limit on the capacity, it may be desirable to design the electronic circuit so as to be regarded as a plurality of areas different from each other in terms of the intrinsically safe explosion-proof requirements However, a fact that a special design and an increase in a size of the connector are accompanied in order for the electronic circuit to be regarded as the plurality of areas is undesirable in terms of a manufacturing cost and a mounting space of an electronic component It is desired to achieve both separation of electronic circuit areas and use of a general-purpose connector in a communication device in which an electronic circuit is composed of a control substrate and a sub-substrate.

CITATION LIST

Patent Literature

Patent Literature 1: Japanese Patent Application No. 2009-054940

SUMMARY OF THE INVENTION

Problems to be Solved by the Invention

It is a problem of the present invention to provide, a communication device capable of achieving both separation of electronic circuit areas and use of a general-purpose connector, in a communication device in which an electronic circuit is composed of a control substrate and a sub-substrate.

Solution to Problem

In order to solve the aforementioned problem, the present invention is a communication device including: a metal case disposed in a dangerous area; a control substrate connected to a battery module; and a sub-substrate connected to this control substrate via a connector, the control substrate and the sub-substrate being housed in the metal case, and the sub-substrate being capable of contactless communication with the communication equipment located outside the case, wherein one of the control substrate and the sub-substrate is provided with: a power supply line and communication lines connected to an other of the control substrate and the sub-substrate; a first electric current limiting element and a first voltage limiting element connected to the power supply line; and a second electric current limiting element and a second voltage limiting element connected to the communication lines, and wherein in the electronic circuit composed of the control substrate and the sub-substrate, a first area connected to one side of the power supply line and the communication lines and a second area connected to an other side thereof with reference to the first and second electric current limiting elements and the first and second voltage limiting elements are arranged spaced apart from each other by a predetermined interval in such a manner that the areas are regarded as separate areas in terms of intrinsically safe explosion-proof requirements.

Effect of the Invention

According to the present invention, in a communication device in which an electronic circuit is composed of a control substrate and a sub-substrate, both separation of electronic circuit areas and use of a general-purpose connector can be achieved.

MODE FOR CARRYING OUT THE INVENTION

An embodiment of the present invention is described below with reference to the accompanying drawings.

Figure 1:
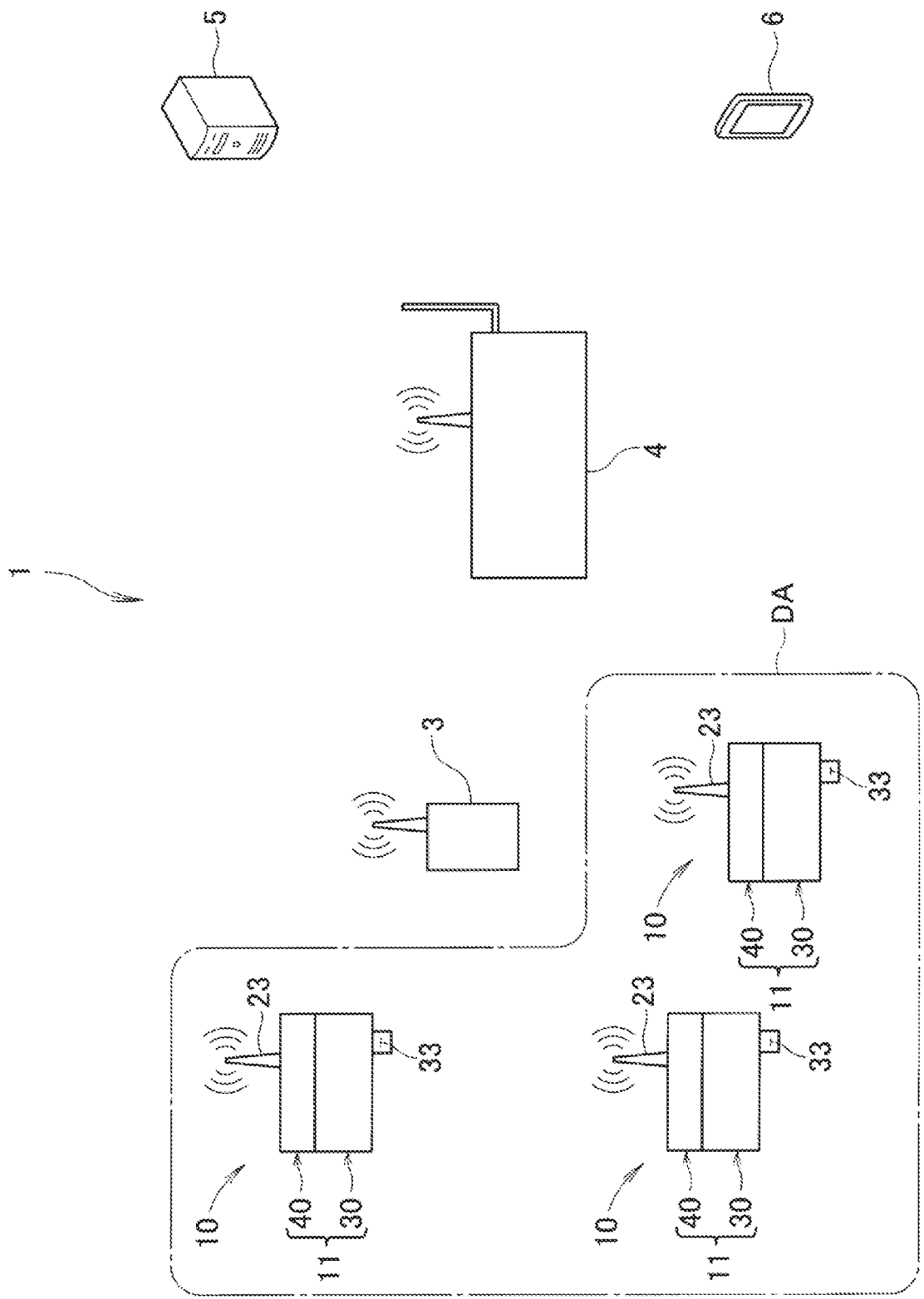
FIG. 1 is a diagram schematically showing a plant equipment state collection system in which a detection device (communication device) according to example 1 of the present invention is used.

Reference is made to FIG. 1 FIG. 1 shows a plant equipment state collection system 1 in a petrochemical plant The petrochemical plant is very large Therefore, each equipment is detected by a detection device 10 (communication device 10) and detected information is managed in a data storage management device 5.

More specifically, the detection device 10 is attached to each equipment in the plant, and thus a plurality of the detection devices 10 are disposed in a dangerous area DA The information detected by these detection devices 10 is transmitted to a network construction device 4 via a repeater 3 and transmitted to the data storage management device 5 A plant manager can check the information stored in the storage management device 5 with the use of a notebook computer (management terminal) (not shown).

While three detection devices 10 are shown in FIG. 1, a number of the detection device 10 may be four or more, or may be one or two.

A state detected by the detection device 10 includes a temperature, a vibration, and the like When abnormality of the state is recognized, the manager sends a worker to the detection device 10 which has detected the abnormality so as to make confirmation.

Figure 2:
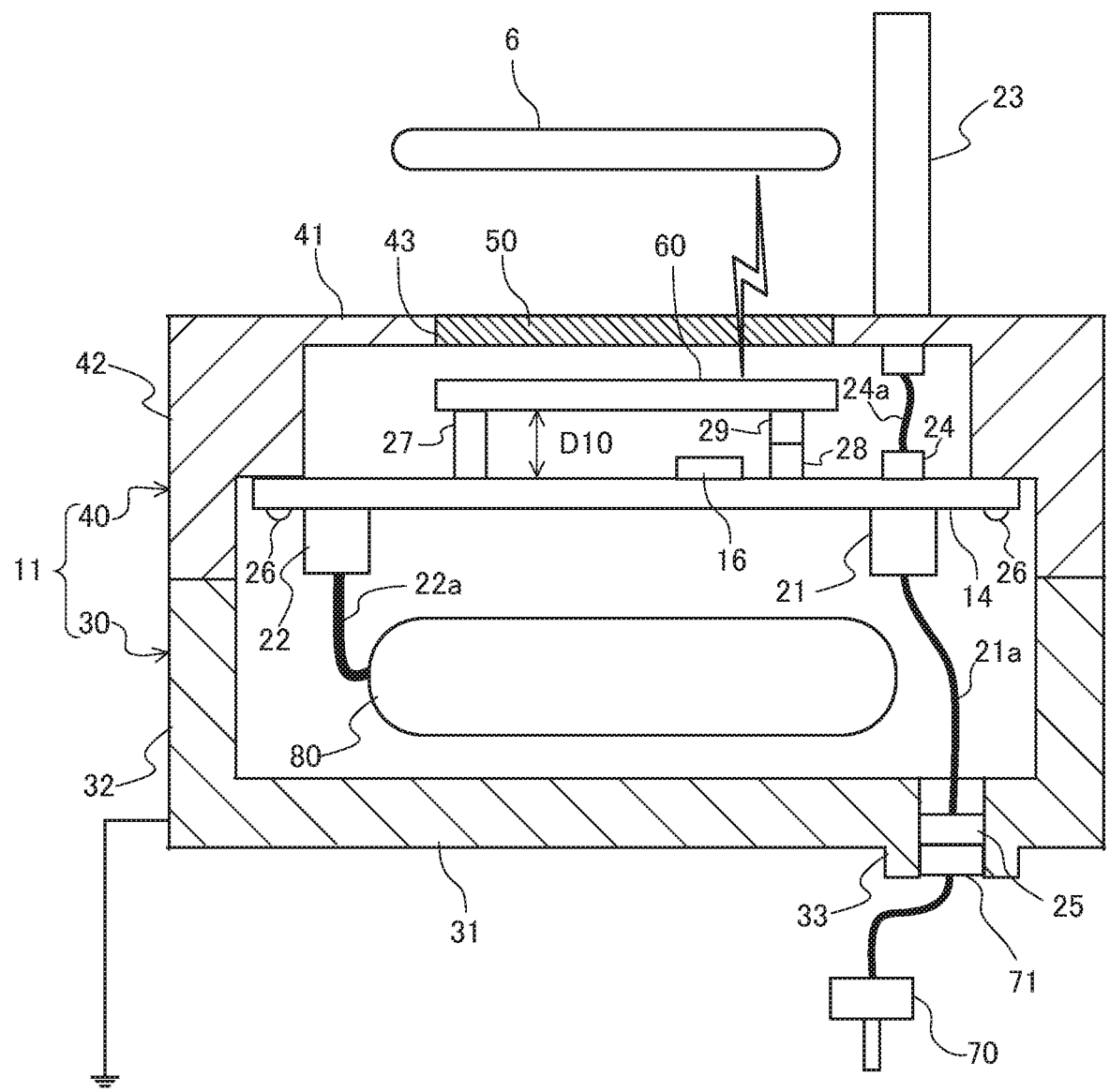
FIG. 2 is a cross-sectional view of the detection device shown in FIG. 1.

Reference is made to FIG. 2 Since the plurality of detection devices 10 are provided in the plant, in order to confirm whether the detection device 10 has detected the abnormality, the worker holds a mobile terminal 6 such as a tablet terminal (communication equipment 6) over the detection device 10 to perform communication For the communication between the mobile terminal 6 and the detection device 10, NFC (Near Field communication) standard which is a short-range radio communication can be adopted For example, in case of the detection device 10 that has detected the abnormality, an indication is displayed on a display unit of the mobile terminal 6 accordingly.

The detection device 10 includes as its main component: a metal case 11; a window member 50 provided in an opening 43 formed in this case 11; a control substrate 14 fixed to the case 11; a sub-substrate 60 which is connected to this control substrate 14 and arranged in proximity to a lower surface of the window member 50; a communication module 16 which is mounted on the control substrate 14; a sensor 70 which is connected to the control substrate 14 and detects a state of equipment; a sensor connector 21 which connects the control substrate 14 to the sensor 70 via a cable 21a; a battery module 80 composed of a battery or the like which supplies power to the control substrate 14; a battery connector 22 which connects the control substrate 14 to the battery module 80 via a cable 22a; an antenna 23 provided in an upper surface of the case 11; an MMCX connector 24 which connects the control substrate 14 to the antenna 23 via a cable 24a; and an external connector 25 which connects the cable 21a to a connector 71 of the sensor 70.

The case 11 is comprised of a first divided body 30 which is arranged at a lower side and an upper part of which is opened; and a second divided body 40 which is superposed on the first divided body 30. These first divided body 30 and second divided body 40 are fastened by bolts and nuts (not shown) When necessary, a surface treatment such as painting is performed on a surface of the case 11.

The first divided body 30 is comprised of: a bottom part 31 having a substantially rectangular shape in a bottom view; and a lower side wall part 32 raised from each edge of this bottom part 31.

Apart of the bottom part 31 protrudes downward so as to be a connector housing part 33 in which the external connector 25 is housed.

The lower side wall part 32 is grounded (earthed).

The second divided body 40 is comprised of a lid part 41 having a substantially rectangular shape in a plan view; and an upper side wall part 42 which is lowered from each edge of this lid part 41.

A substantially rectangular opening 43 is formed at a center of the lid part 41 An area of the opening 43 in a plan view is set to be 1600 mm$^2$ or less An antenna mounting hole (not shown) to which the antenna 23 is attached is formed adjacent to the opening 43.

The upper side wall part 42 is continuous with the lower side wall part 32.

The window member 50 is provided so as to close the opening 43 of the second divided body 40 A material of the window member 50 is made of a resin which has electric insulation properties and transmits radio waves or magnetism used for contactless communication.

A multilayer printed circuit-board is employed for the control substrate 14 The control substrate 14 is fixed to a back surface of the first divided body 30 by a screw 26 The control substrate 14 is grounded The control substrate 14 may be provided with a light-emitting element of which lighting, blinking, and turning-off are switched by the control substrate 14.

A multilayer printed circuit-board is employed for the sub-substrate 60 The sub-substrate 60 is provided spaced apart from the control substrate 14 for at least 1.5 mm or more (see an interval D10) by a spacer 27, and is connected to the control substrate 14 via B to B (Board to Board) connectors 28, 29 For the B to B connectors 28, 29, a general-purpose connector having a distance between terminals, that is narrower than 1.5 mm, can be employed A reason why the general-purpose connector can be employed for the B to B connectors 28, 29 will be described later A flexible printed circuit-board may be employed for the sub-substrate 60 In this case, the sub-substrate 60 may be affixed to a back surface of the window member 50.

Figure 3:
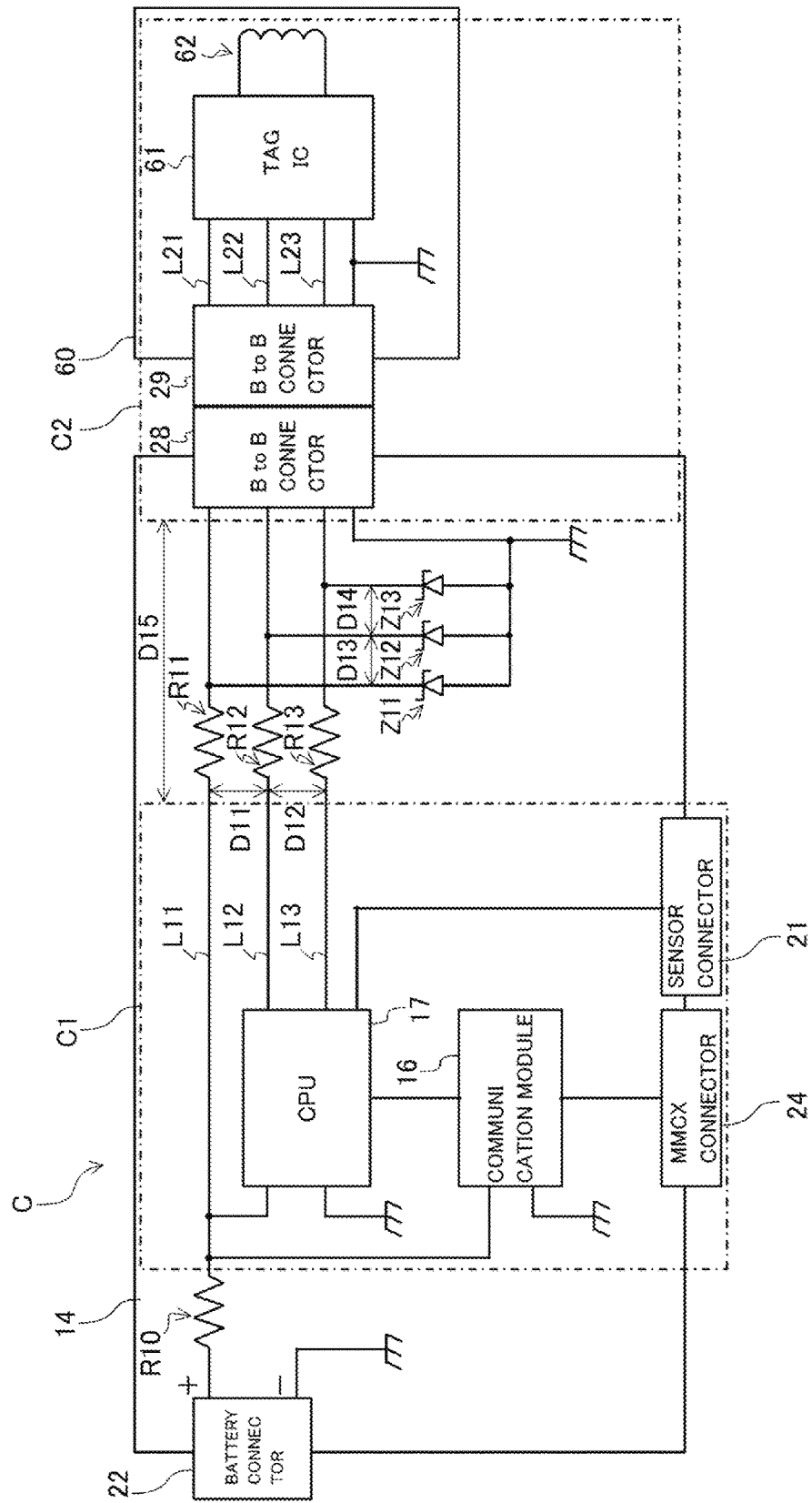
FIG. 3 is a diagram showing an equivalent circuit of the detection device shown in FIG. 2.

Reference is also made to FIG. 3 An electronic circuit C is composed of the control substrate 14 the sub-substrate 60 On the control substrate 14, the communication module 16, a CPU (Central Processing Unit) 17, the sensor connector 21, a battery connector 22, the MMX connector 24, and the B to B connector 28 are mounted On the sub-substrate 60, the B to B connector 29, a tag IC 61, and an antenna part 62 are mounted.

Furthermore, the control substrate 14 is provided with: a power supply line L11 which connects a plus terminal of the battery connector 22 (connected to a positive electrode of the battery module 80) and the B to B connector 28; and communication lines L12, L13 which connect the CPU 17 and the B to B connector A minus terminal of the battery connector 22 (connected to a negative electrode of the battery module 80) is grounded The sub-substrate 60 is provided with: a power supply line L21 which connects the B to B connector 29 and a tag IC 61 and supplies power from the control substrate 14 to the sub-substrate 60; and communication lines L22, L23 which connect the B to B connector 29 and the tag IC 61 The power supply line L11 and the power supply line L21 are connected to each other via the B to B connectors 28, 29, and supply power from the battery module 80 to the control substrate 14 and the sub-substrate 60 The communication line L12 and the communication line L22, and the communication line L13 and the communication line L23 are connected to each other via the B to B connectors 28, 29, and communication is possible between the control substrate 14 (the CPU 17) and the sub-substrate 60 (the tag IC 61) For the communication between the CPU 17 and the tag IC 61, for example, I2C (Inter-Integrated Circuit) method is used, and the communication lines L12, L22 and the communication lines L13, L23 respectively function as a communication line for a clock signal and a communication line for a data signal In the electronic circuit C, a power control unit which controls power supply to the control substrate 14 (the communication module 16 and the CPU 17) and the sub-substrate 60 (the tag IC 61) may be further provided, and the supply of power may be stopped or a supply amount of power may be lowered when not needed.

The communication module 16 is started at a preset interval under a control of the CPU 17, and has a function to transmit to the repeater 3 information that the sensor 70 has detected via the antenna 23 and information that is input to the tag IC 61 from the mobile terminal 6 by contactless communication.

The CPU 17 has a function to, for example, control the entire detection device 10 Specifically, the CPU 17 has a function to control operation of the communication module 16, the tag IC 61, and the sensor 70.

Tag IC 61 is started by contactless communication with the mobile terminal 6 or by power supply from the power supply line L21, and has a function to store information that is input from the CPU 17 or the mobile terminal 6 and a function to transmit the stored information to the CPU 17 or the mobile terminal 6.

The antenna part 62 is an antenna for performing contactless communication with the mobile terminal 6 The antenna part 62 is formed with a predetermined antenna pattern on the sub-substrate 60 by a material having electrical conductivity.

Next, separation of an area in terms of intrinsically safe explosion-proof requirements (JIS C60079) in the electronic circuit C composed of the control substrate 14 and the sub-substrate 60 will be described.

A power regulating resistor R10 and a first electric current limiting resistor R11 are connected in series to the power supply line L11 of the control substrate 14 The first electric current limiting resistor R11 functions as a first electric current limiting element that limits a current supplied to the sub-substrate 60 from the power supply line L11 In addition, a first voltage limiting Zener diode Z11 is connected in parallel with the power supply line L11 between the first electric current limiting resistor R11 and the B to B connector 28 A negative electrode of the first voltage limiting Zener diode Z11 is connected to the power supply line L11, and the positive electrode thereof is grounded The first voltage limiting Zener diode Z11 functions as a first voltage limiting element that limits a voltage applied to the sub-substrate 60 from the power supply line L11 Second electric current limiting resistors R12, R13 are respectively connected in series with the communication lines L12, L13 (one second electric current limiting resistor is provided in each communication line) The second electric current limiting resistors R12, R13 function as a second electric current limiting element that limits a current supplied to the sub-substrate 60 from the communication lines L12, L13 In addition, second voltage limiting Zener diodes Z12, Z13 are connected in parallel with the communication lines L12, L13 between the electric current limiting resistors R12, R13 and the B to B connector 28 (one second voltage limiting Zener diode is provided in each communication line) Negative electrodes of the second voltage limiting Zener diodes Z12, Z13 are connected to the communication lines L12, L13, and the positive electrodes thereof are grounded The second voltage limiting Zener diodes Z12, Z13 function as a second voltage limiting element that limits the voltage applied to the sub-substrate 60 from the communication lines L12, L13 Between the first electric current limiting resistor R11 and the second electric current limiting resistor R12, and between the second electric current limiting resistor R12 and the second electric current limiting resistor R13, there is a distance of 1.5 mm or more (see intervals D11 and D12) In addition, between the first voltage limiting Zener diode Z11 and the second voltage limiting Zener diode Z12, and between the second voltage limiting Zener diode Z12 and the second voltage limiting Zener diode Z13, there is a distance of 1.5 mm or more (see intervals D13 and D14) Furthermore, with reference to the first and second electric current limiting resistors R11-R13 and the first and second voltage limiting Zener diodes Z11-Z13, a first area C1 connected to one side of the power supply line L11 and the communication lines L12, L13 (left side in FIG. 3) and a second area C2 connected to an other side (right side in FIG. 3) are arranged spaced apart from each other by 1.5 mm or more in a horizontal direction with respect to a mounting surface of the control substrate 14 (see interval D15) A boundary of the first area C1 and a boundary of the second area C2 in the horizontal direction with respect to the mounting surface of the control substrate 14 are defined by an outermost one of electronic components constituting each area Therefore, the interval D15 between the first area C1 and the second area C2 is a shortest distance between the electronic components constituting the first area C1 and the electronic components constituting the second area C2 In addition, as aforementioned, the control substrate 14 and the sub-substrate 60 are connected spaced apart from each other by 1.5 mm or more (see the interval D10) That is, the first area C1 and the second area C2 are arranged spaced apart from each other by 1.5 mm or more even in a direction perpendicular to the control substrate 14 (a vertical direction with respect to the mounting surface of the control substrate 14).

In this way, the first area C1 and the second area C2 are provided with the electric current limiting resistors R11-R13 and the voltage limiting Zener diodes Z11-Z13 in all of the lines L11-L13 (except a ground line) which connect the areas with each other and on which a current flows and a voltage is applied, and the areas are arranged spaced apart from each other by 1.5 mm or more In addition, the electric current limiting resistors R11-R13 and the voltage limiting Zener diodes Z11-Z13 are respectively spaced apart from each other by 1.5 mm or more With this, the first area C1 and the second area C2 are can be regarded as separate areas in terms of intrinsically safe explosion-proof requirements, and a limit on capacity is alleviated The intervals D10, D15 between the first area C1 and the second area C2, the intervals D11, D12 between the electric current limiting resistors R11-R13 themselves, and the intervals D13, D14 between the limiting Zener diodes Z11-Z13 themselves may be any interval such that the first area C1 and the second area C2 can be regarded as separate areas in terms of the intrinsically safe explosion-proof requirements, and are appropriately defined in accordance with a protection level desired to be adopted to a voltage value applied to the electronic circuit C The interval of 1.5 mm is adapted to all protection levels in an electronic circuit to which a voltage value of less than 10V is applied In addition, providing all of the electric current limiting resistors R11-R13 and the voltage limiting Zener diodes Z11-Z13 in the control substrate 14 results in that the B to B connectors 28, 29 (all terminals of the B to B connectors 28, 29) are included in the second area C2 In the intrinsically safe explosion-proof requirements, there is no definition relating to a distance between electronic components in a same area, and therefore, there is no restriction on a distance between the B to B connectors 28, 29 for being adapted to the intrinsically safe explosion-proof requirements, and thus a general-purpose connector having a distance between the terminals of 1.5 mm or less can be employed for the B to B connectors 28, 29.

The present invention described above exhibits the following effects.

The detection device 10 is a communication device such that the control substrate 14 connected to the battery module 80 and the sub-substrate 60 connected to the control substrate 14 via the B to B connectors 28, 29 are housed in the metal case 11 that is disposed in the dangerous area DA, and that the sub-substrate 60 is capable of contactless communication with the communication equipment (mobile terminal 6) located outside the case 11.

The control substrate 14 is provided with: the power supply line L11 and the communication lines L12, L13 that are connected to the sub-substrate 60; the first electric current limiting element (the first electric current limiting resistor R11) and the first voltage limiting element (the first voltage limiting Zener diode Z11) that are connected to the power supply line L11; and the second electric current limiting elements (the second electric current limiting resistors R12, R13) and the second voltage limiting elements (second voltage limiting Zener diode Z12, Z13) that are connected to the communication lines L12, L13.

In the electronic circuit C composed of the control substrate 14 and the sub-substrate 60, the first area C1 connected to one side of the power supply line L11 and the communication lines L12, L13 and the second area C2 connected to the other side thereof with reference to the first and second electric current limiting elements and the first and second voltage limiting elements are arranged spaced apart from each other by predetermined intervals D10, D15 in such a manner that the areas are regarded as separate areas in terms of the intrinsically safe explosion-proof requirements.

According to this, both the separation of the area of the electronic circuit C in terms of the intrinsically safe explosion-proof requirements and the use of a general-purpose connector as the connectors 28, 29 that connects the control substrate 14 and the sub-substrate 60 can be achieved, and a limit on capacity can be alleviated without an increase in a manufacturing cost and a reduction in a mounting space of electronic components.

As a variation, a configuration in which the first and second electric current limiting elements and the first and second voltage limiting elements are provided in the sub-substrate 60 side may be possible That is, in such a variation, the sub-substrate 60 is provided with: the power supply line L21 and the communication lines L22, L23 that are connected to the control substrate 14; the first electric current limiting element and the first voltage limiting element that are connected to the power supply line L21; and the second electric current limiting element and the second voltage limiting element that are connected to the communication lines L22, L23 In the electronic circuit C composed of the control substrate 14 and the sub-substrate 60, a first area connected to one side of the power supply line L21 and the communication lines L22, L23 and a second area connected to the other side thereof with reference to the first and second electric current limiting elements and the first and second voltage limiting elements are arranged spaced apart from each other by a predetermined interval in such a manner that the areas are regarded as separate areas in terms of the intrinsically safe explosion-proof requirements Even by the above-described variation, the same operation and effect as those of the above-described embodiment can be obtained.

The first area C1 and the second area C2 are arranged spaced apart from each other by 1.5 mm or more as intervals D10, D15 According to this, high intrinsic safety explosion-proof can be provided.

The first and second electric current limiting elements are arranged spaced apart from each other by 1.5 mm or more, and the first and second voltage limiting elements are arranged spaced apart from each other by 1.5 mm or more According to this, high intrinsic safety explosion-proof can be provided.

While the communication device according to the present invention has been described taking as an example the use in the petrochemical plant, the communication device may be used even in other dangerous areas. The dangerous area includes, for example, an LP gas filling station, a tunnel excavation construction site, a thermal power plant, a painting plant, and the like.

In addition, while the communication device has been described taking the detection device as an example, as long as the device performs radio communication with equipment outside the case, the device may be applied not only to the detection device but also to other devices.

Moreover, a blocking diode may be used as the first and second electric current limiting elements In addition, the connector is not limited to the B to B connector, and a known connector can be suitably used.

That is, as long as the operation and effect of the present invention are exhibited, the present invention is not limited to the above-described embodiment For example, the window member and the sub-substrate may be integrally provided in the second divided body, and the control substrate may be fixed to the first divided body.

INDUSTRIAL APPLICABILITY

The communication device of the present invention is suitable as a detection device used in a petrochemical plant.

DESCRIPTION OF REFERENCE NUMERALS

6 . . . mobile terminal (communication equipment)
10 . . . detection device (communication device)
11 . . . case
14 . . . control substrate
28, 29 . . . B to B connector (connector)
30 . . . first divided body
40 . . . second divided body
43 . . . opening
50 . . . window member
60 . . . sub-substrate
80 . . . battery module
C . . . electronic circuit
C1 . . . first area
C2 . . . second area
D10-D15 . . . interval
Da . . . dangerous area
L11, L21 . . . power supply line
L12, L13, L22, L23 . . . communication line
R11 . . . first electric current limiting resistor (first electric current limiting element)
R12, R13 . . . second electric current limiting resistor (second electric current limiting element)
Z11 . . . first voltage limiting Zener diode (first voltage limiting element)

Z12, Z13 . . . second voltage limiting Zener diode (second voltage limiting element)

The invention claimed is:
1. A communication device comprising:
a metal case disposed in a dangerous area;
a control substrate connected to a battery module; and a sub-substrate connected to this control substrate via a connector, the control substrate and the sub-substrate being housed in the metal case, and the sub-substrate being capable of contactless communication with the communication equipment located outside the case,
wherein one of the control substrate and the sub-substrate is provided with: a power supply line and communication lines connected to the other of the control substrate and the sub-substrate; a first electric current limiting element and a first voltage limiting element connected to the power supply line; and a second electric current limiting element and a second voltage limiting element connected to the communication lines, and
wherein in an electronic circuit composed of the control substrate and the sub-substrate, a first area connected to one side of the power supply line and the communication lines and a second area connected to an other side thereof with reference to the first and second electric current limiting elements and the first and second voltage limiting elements are arranged spaced apart from each other by a predetermined interval in such a manner that the areas are regarded as separate areas in terms of intrinsically safe explosion-proof requirements.

2. The communication device according to claim 1, wherein the first area and the second area are arranged spaced apart from each other by 1.5 mm or more as the interval.

3. The communication device according to claim 1, wherein the first and second electric current limiting elements are arranged spaced apart from each other by 1.5 mm or more, and the first and second voltage limiting elements are arranged spaced apart from each other by 1.5 mm or more.

4. The communication device according to claim 2, wherein the first and second electric current limiting elements are arranged spaced apart from each other by 1.5 mm or more, and the first and second voltage limiting elements are arranged spaced apart from each other by 1.5 mm or more.

* * * * *